United States Patent
Sasaki

(10) Patent No.: US 7,944,036 B2
(45) Date of Patent: May 17, 2011

(54) SEMICONDUCTOR DEVICE INCLUDING MOUNTING BOARD WITH STITCHES AND FIRST AND SECOND SEMICONDUCTOR CHIPS

(75) Inventor: Kou Sasaki, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 497 days.

(21) Appl. No.: 12/076,065

(22) Filed: Mar. 13, 2008

(65) Prior Publication Data

US 2008/0230888 A1    Sep. 25, 2008

(30) Foreign Application Priority Data

Mar. 19, 2007    (JP) .................. 2007-070396

(51) Int. Cl.
*H01L 23/48* (2006.01)
(52) U.S. Cl. ................. 257/686; 257/777; 257/784
(58) Field of Classification Search .................. 257/686, 257/777, 784
See application file for complete search history.

(56) References Cited

U.S. PATENT DOCUMENTS

| 6,900,528 B2 * | 5/2005 | Mess et al. ............ 257/686 |
| 6,958,532 B1 | 10/2005 | Nakayama |
| 7,224,052 B2 * | 5/2007 | Nishizawa et al. .......... 257/679 |
| 2005/0253236 A1 | 11/2005 | Nakayama |

FOREIGN PATENT DOCUMENTS

| JP | 1-235264 | 9/1989 |
| JP | 11-54693 | 2/1999 |
| JP | 11-74451 | 3/1999 |
| JP | 2000-332194 | 11/2000 |
| JP | 2001-7278 | 1/2001 |
| JP | 2002-302871 | 10/2005 |
| JP | 2005-317830 | 11/2005 |

\* cited by examiner

*Primary Examiner* — Thanh V Pham
*Assistant Examiner* — Caleb Henry
(74) *Attorney, Agent, or Firm* — McGinn IP Law Group, PLLC

(57) ABSTRACT

A first memory chip (103*a*) and a second memory chip (103*b*) mounted in this order on one surface of a mounting board (101) each have a rectangular planar shape and include a plurality of electrode pads formed in a single line along one side of the rectangle. An electrode pad line of the second memory chip (103*b*) is formed in parallel with an electrode pad line of the first memory chip (103*a*). A chip select pad is disposed on an end of the electrode pad line. Control pads, address pads, or data pads (113*a*) of the first memory chip (103*a*) are wire bonded to first stitches (109) formed in a single line along one side of the rectangle. A chip select pad (121*a*) and a chip select pad (121*b*) are wire bonded to second stitches (111) formed in a line along a side adjacent to a side of the chip select pad (121*a*). Accordingly, an increase in package area is suppressed when a plurality of memory chips are stacked.

16 Claims, 8 Drawing Sheets

Related Art

SEMICONDUCTOR DEVICE INCLUDING MOUNTING BOARD WITH STITCHES AND FIRST AND SECOND SEMICONDUCTOR CHIPS

BACKGROUND OF THE INVENTION

1. Field of the Invention

The present invention relates to a semiconductor device, and more particularly, to a system-in-package (SiP) technology.

2. Description of the Related Art

Various stack-type semiconductor devices and bonding methods therefor have been discussed.

As an example thereof, a technology for connecting a memory chip to a lead terminal of a lead frame is disclosed in each of JP 11-054693 A, JP 11-074451 A, and JP 2000-332194 A.

JP 11-054693 A and JP 11-074451 A each disclose a semiconductor device having a first semiconductor chip and a second semiconductor chip stacked in the stated order on an island. The first and second semiconductor chips are memory chips. The second semiconductor chip, which is slightly smaller than the first semiconductor chip, is mounted on a central portion of the first semiconductor chip, and two opposing sides of the first semiconductor chip are exposed from the second semiconductor chip. On each of the two opposing sides, first bonding pads are formed in an exposed portion from the opposing side to each side adjacent to the opposing side, along an outer periphery of the first semiconductor chip. Among the first bonding pads, bonding pads that are positioned on ends of the opposing side are wire bonded to lead terminals each facing the adjacent side.

JP 2000-332194 A discloses a multi-chip package having two small and large chips stacked on top of each other.

In the device disclosed in JP 11-054693 A, among the electrode pads formed on one side of the second semiconductor chip, an electrode pad positioned on an end of the one side is connected to a chip enable pin ICE/2 across the opposing side of the first semiconductor chip.

Further, a technology for mounting a chip on a wiring board is disclosed in each of JP 01-235264 A, JP 2005-317830 A, JP 2005-302871 A, and JP 2001-007278 A.

JP 01-235264 A discloses an example where a terminal to be bonded to a chip enable terminal CE of a printed wiring board is formed on a corner of a chip.

JP 2005-317830 A discloses a multi-chip package having a lower memory chip, an upper memory chip, and a CPU chip that are mounted in the stated order on an insulating substrate. In the package, the CPU chip has a rectangular shape, and pads are formed along each of four sides of the CPU chip. Further, substrate pads are formed on the insulating substrate along each side of the CPU chip. The pads of the CPU chip are bonded to electrode pads that are formed along one of the sides on which the pads of the CPU chip are formed.

JP 2005-302871 A discloses a stacked semiconductor device including a plurality of semiconductor devices that are stacked on top of each other to be displaced stepwise in a direction perpendicular to one side of a substrate. On a first substrate on which the semiconductor devices are to be mounted, lines of bonding pads corresponding to the number of semiconductor devices are formed. The semiconductor devices each have a structure in which a chip is flip-chip connected to the substrate. Bonding pads of the semiconductor device formed in a lowermost layer are connected to bonding pads positioned in a line formed closest to the semiconductor device, among the bonding pads of the first substrate. Among the bonding pads of the first substrate, the bonding pads of the semiconductor device formed in the upper layer are connected to the bonding pads farther apart from the semiconductor device.

Further, JP 2005-302871 A discloses a stacked semiconductor device in which a plurality of semiconductor devices are stacked to be displaced in an L shape along one side of the substrate.

JP 2001-007278 also discloses a stack-type multi-chip package. In the package, a wiring sheet is inserted between an upper chip and a lower chip, and bonding pads formed on a surface of the upper chip and a package substrate are connected to each other through a wiring pattern formed on the wiring sheet.

Incidentally, in recent years, an increase in capacity of a memory package is required. However, in a case of a conventional memory stack, when a plurality of chips are stacked on top of each other, the wires are prevented from being brought into contact with each other, with the result that an entire package area is increased.

For example, in the case of the structure disclosed in JP 2005-302871 A as described above, there are formed as many pad lines on the substrate as the number of semiconductor devices stacked on at least one side of each of the semiconductor devices constituting the stack. Accordingly, a pad forming region of the package substrate is large, so there is room for improvement in terms of reducing the size of the package.

Further, in the structure disclosed in 2005-302871 A, when the number of pad lines on the substrate is to be simply reduced, there is a fear that the arrangement of bonding wires are complicated and the wires are brought into contact with each other. Further, there is another fear that, in order to prevent the wires from being brought into contact with each other, the package is increased in size. Such points will be described below with reference to FIGS. 13 and 14.

FIG. 13 is a plan view showing a structure of a semiconductor device which has been discussed by the inventors of the present invention. FIG. 14 is a cross-sectional diagram of the semiconductor device taken along a direction in which the chips are displaced.

In a semiconductor device 200 shown in FIGS. 13 and 14, terminals, that is, electrode pads of the chips are each arranged on one side. The arrangement of the pads each functioning as a chip select (hereinafter, referred to as "CS") terminal is not considered.

Specifically, on a mounting board 201, a first memory chip 203a, a second memory chip 203b, and a third memory chip 203c are stacked in the stated order. Those memory chips are sealed with a sealing resin 205. On a back surface of the mounting board 201, bump electrodes 207 are formed.

The first memory chip 203a, the second memory chip 203b, and the third memory chip 203c have the same rectangular planar shape, and each include electrode pads arranged in a single line along one side of the rectangle. The chips are displaced stepwise to be stacked on top of each other so that an electrode pad forming region of each chip is exposed. Among the electrode pads formed on each chip, electrode pads each functioning as an address terminal or a data terminal are wire bonded to each other (for example, wire 217 and wire 219) between the chips.

Stitches of the mounting board 201 are arranged so as to be adjacent to the line of the electrode pads of the first memory chip 203a. In this case, stitches for terminals that can be used both for address and data are arranged in a single line so as to be adjacent to the electrode pad forming region of the first memory chip 203a, and stitches (stitches 211b and 211c) for chip select of each of the second memory chip 203b and the third memory chip 203c are further arranged outside the line of the stitches for terminals.

A CS pad 221a of the first memory chip 203a, a CS pad 221b of the second memory chip 203b, and a CS pad 221c of the third memory chip 203c are each directly wire bonded to the stitch 211a, the stitch 211b, and the stitch 211c of each chip, through a wire 231, a wire 233, and a wire 235.

Thus, on each memory chip, an address terminal or a data terminal and a CS terminal are formed for each chip, and the electrode pad functioning as the CS terminal cannot be bonded through the electrode pad of another chip. While the adjacent wires are taken into consideration, the CS terminal of each chip is directly wired to the stitch on the mounting board.

However, in a structure of a conventional semiconductor package of a memory stack type, arrangement of the electrode pads functioning as chip select terminals and a reduction in size of the entire package are not considered. As a result, as shown in FIG. 13, the wire connecting the chip select pad and the stitch on the board to each other strides over or intersects another wire in some areas, which complicates the wiring. Accordingly, it is necessary to sufficiently secure a space for preventing the wires from being brought into contact with each other, which becomes a cause of the increase in size of the package.

Further, in order to prevent the wires from intersecting each other, when a line of stitches is formed for each chip as disclosed in 2005-302871 A, it is necessary to provide a large space for forming the lines of the stitches on the mounting board, which results in the increase in size of the package.

SUMMARY

In one embodiment, there is provided a semiconductor device comprising a mounting board having first and second electrode pads formed on a surface thereof, said first electrode pad arranged on a first line, said second electrode pad arranged on a second line intersecting with said first line; and a semiconductor chip mounted on said mounting board and having a first electrode pad group including a plurality of electrode pads formed on a surface of said semiconductor chip, one of said plurality of electrode pads having a minimum distance from said second electrode pad, being electrically connected to said second electrode pad, and receiving a chip select signal to select said semiconductor chip via said second electrode pad, another electrode pad in said first electrode pad group being electrically connected to said first electrode pad, and receiving a signal except for said chip select signal via said first electrode pad.

the electrode pads formed on a semiconductor chip include multiple kinds of electrode pads having different functions, specifically, the chip select pad and the pads other than the chip select pad. Specific examples of the pads other than the chip select pad include a control pad, which excludes the chip select pad but include a power supply and a ground, an address pad, and a data pad. When a plurality of such semiconductor chips are stacked on top of each other, the chip select pads of the chips are directly wired to different stitches among the stitches each functioning as the chip select terminal of the mounting board. For this reason, in the conventional structure in which the arrangement of the chip select pads and wiring directions are not considered, as the number of chips to be stacked is increased, the package area is also increased.

On the other hand, the electrode pads are formed in a single line along one side of the rectangle of each of the first semiconductor chip and the second semiconductor chip, and each of the chip select pads is disposed on the end of the line.

Further, on the mounting board, stitches are formed in one line in each different direction. Specifically, there are formed first stitches arranged along the one side of the first memory chip, and second stitches arranged along a side adjacent to the one side on the side of the chip select pads.

The chip select pads of the semiconductor chips are wire bonded to the different second stitches, and the electrode pads other than the chip select pads are wire bonded to the first stitches.

Thus, in one embodiment, the chip select pads are arranged on the end of each line of the electrode pads, and the chip select pads are wired to the stitches that are arranged along a direction different from that in which the electrode pads are arranged. As a result, in each chip, a connection distance between each chip select pad and each second stitch can be reduced. Further, the second stitches are arranged in a direction different from that in which the first stitches are arranged. Accordingly, even when a plurality of semiconductor chips are stacked on top of each other, the wire connecting each chip select pad and each second stitch to each other can be prevented from striding over or intersecting another wire connected to the electrode pad of the chip select pad, for example. As a result, the necessary space to be secured so as to prevent the wires from being brought into contact with each other can be reduced in size. Therefore, also in the case of stacking a plurality of memory chips on top of each other, it is possible to suppress the increase in package size which is determined depending on a balance among an area of a chip mounting region on one surface of the mounting board, an area of a stitch forming region, an area and a thickness of a region necessary for preventing the wires from being brought into contact with each other, and the like.

As described above, the increase in package area in the case of stacking a plurality of semiconductor chips on top of each other can be suppressed.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, embodiments of the present invention will be described with reference to the drawings. Note that components common to all the drawings are denoted by the same reference symbols, and descriptions thereof are appropriately omitted.

First Embodiment

Figure 1:
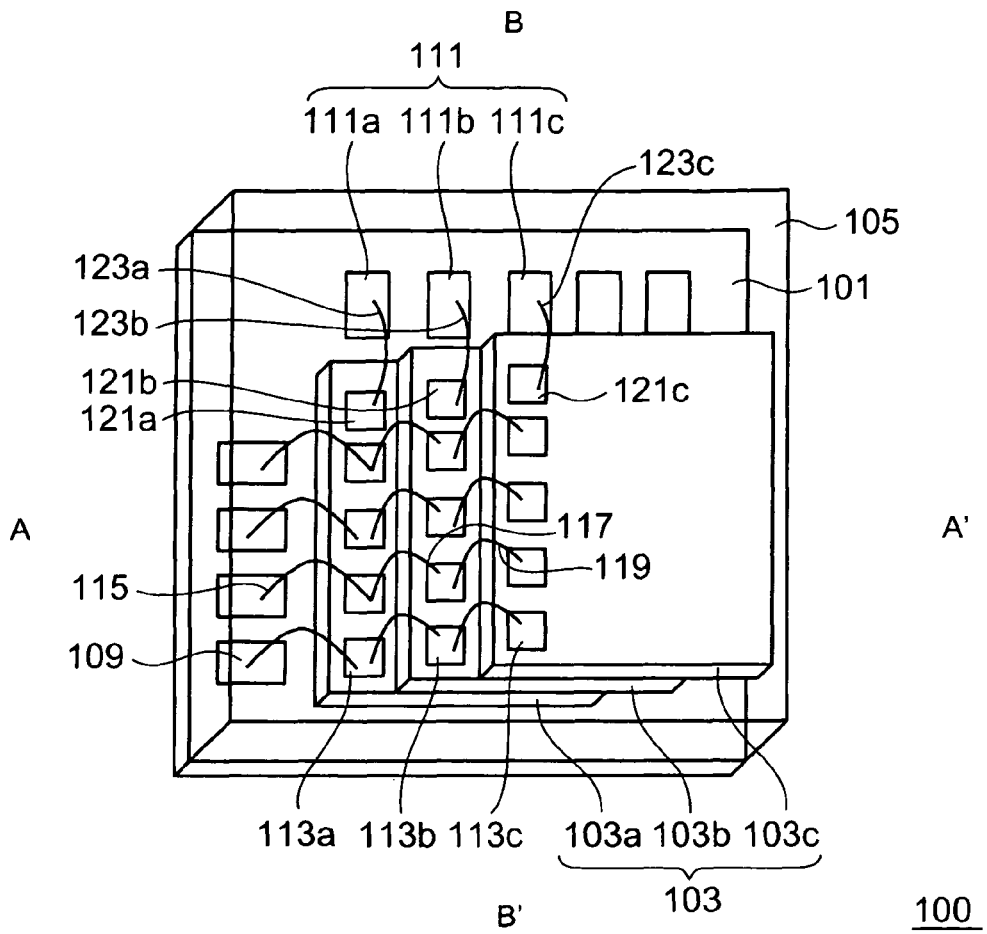
FIG. 1 is a perspective view showing a structure of a semiconductor package according to a first embodiment of the present invention.
Figure 2:
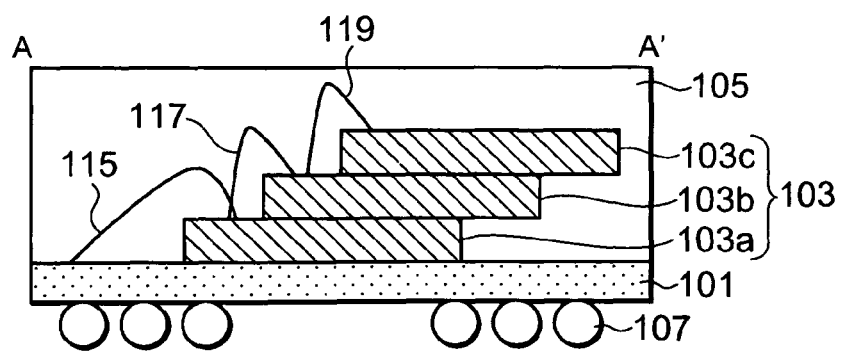
FIG. 2 is a cross-sectional diagram of the semiconductor package taken along the line A-A' of FIG. 1.
Figure 3:
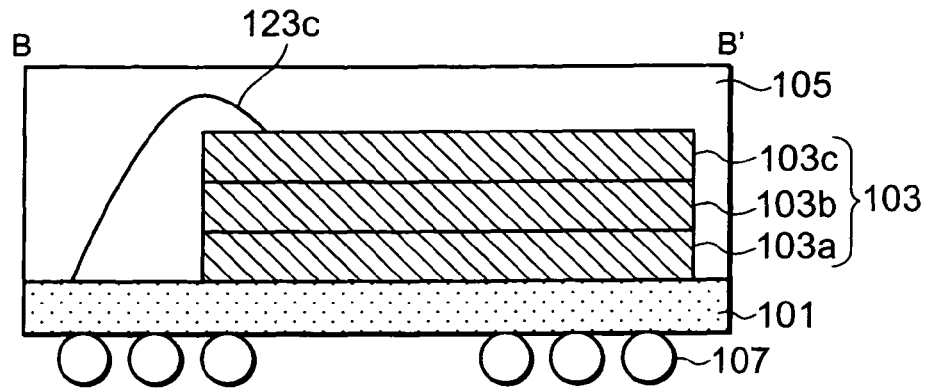
FIG. 3 is a cross-sectional diagram of the semiconductor package taken along the line B-B' of FIG. 1.
Figure 4:
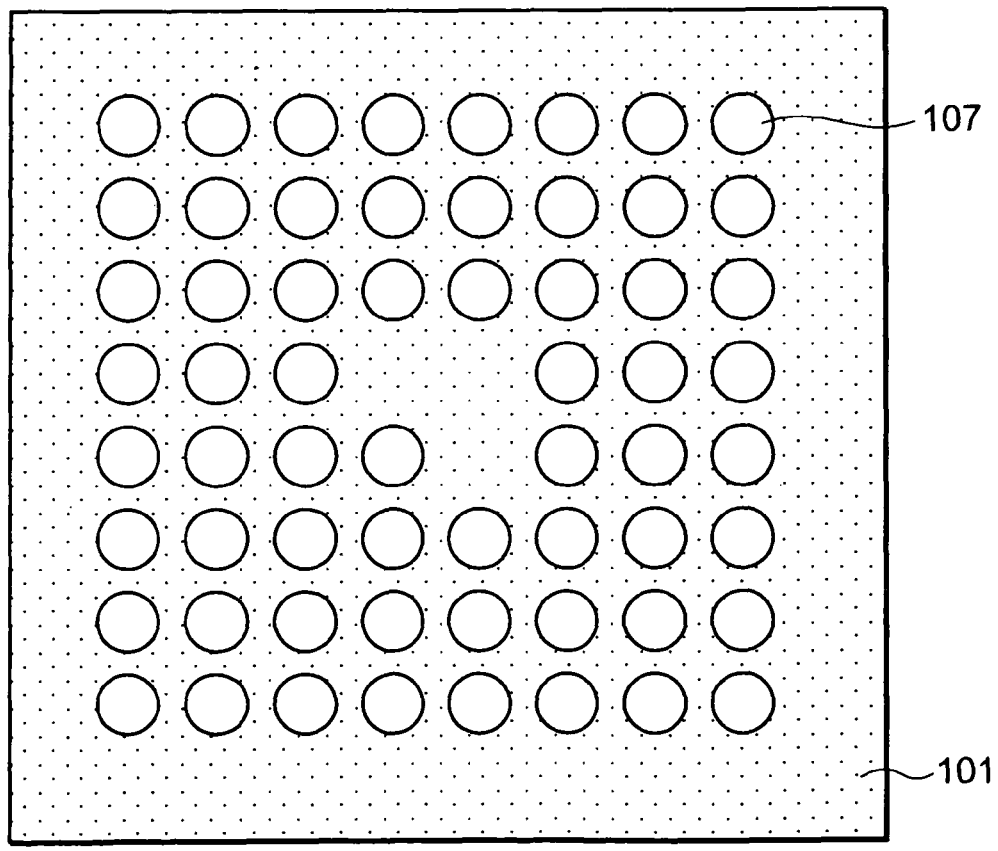
FIG. 4 is a diagram showing a back surface of the semiconductor package of FIG. 1.

FIG. 1 is a perspective view showing a structure of a semiconductor package according to a first embodiment of the present invention. FIG. 2 is a cross-sectional diagram of the semiconductor package taken along the line A-A' of FIG. 1. FIG. 3 is a cross-sectional diagram of the semiconductor package taken along the line B-B' of FIG. 1. FIG. 4 is a plan view showing a back surface of a semiconductor package 100 shown in FIG. 1.

As shown in FIGS. 1 to 4, a semiconductor device (semiconductor package 100) according to the first embodiment of the present invention includes a first memory chip and a second memory chip (first memory chip 103a and second memory chip 103b) mounted in the stated order from below on one surface (chip mounting surface) of a mounting board 101. The semiconductor package 100 further includes a third memory chip 103c mounted on the second memory chip 103b. Hereinafter, the first memory chip 103a, the second memory chip 103b, and the third memory chip 103c are also collectively called a memory chip 103.

A sealing resin 105 is formed on an entire surface of the chip mounting surface of the mounting board 101, and the memory chip 103 is buried in the sealing resin 105. On a back surface of the mounting board 101, a plurality of bump electrodes 107 are arranged in a tetragonal lattice manner.

The first memory chip 103a, the second memory chip 103b, and the third memory chip 103c are memory chips for SiP. The first memory chip 103a, the second memory chip 103b, and the third memory chip 103c each have a rectangular planar shape and each include a plurality of electrode pads arranged in a single line along one side of the rectangle. The line of the electrode pads of each of the second memory chip 103b and the third memory chip 103c is disposed in parallel with the line of the electrode pads of the first memory chip 103a. Moreover, the first memory chip 103a, the second memory chip 103b, and the third memory chip 103c each have no electrode pads formed on a side opposite to the one side on which the line of the electrode pads is disposed.

The plurality of electrode pads formed on the first memory chip 103a include a chip select pad 121a disposed on one end (upward in FIG. 1) of the line of the plurality of electrode pads, and a plurality of (four in FIG. 4) pads other than the chip select pad, specifically, control pads, address pads, or data pads 113a. Similarly, the plurality of electrode pads formed on the second memory chip 103b include a chip select pad 121b formed on one end of the line of the plurality of electrode pads, and four control pads, address pads, or data pads 113b. The plurality of electrode pads formed on the third memory chip 103c include a chip select pad 121c disposed on one end of the line of the plurality of electrode pads, and four control pads, address pads, or data pads 113c.

On the chip mounting surface of the mounting board 101, there are formed a plurality of (four in FIG. 1) first stitches 109 arranged in a single line along the one side of the memory chip 103a, and a plurality of (five in FIG. 1) second stitches 111 arranged in a single line along a side adjacent to the one side on a side of the chip select pad 121a. The stitches formed on the mounting board 101 include the line of the first stitches 109 and the line of the second stitches 111 arranged orthogonally to the line of the first stitches 109. On a side (lower side of FIG. 1) facing the second stitches 111, no stitches are provided. The first stitches 109 each serve as a terminal for control, address, or data, and the second stitches 111 each serve as a terminal for chip select.

The chip select pad 121a, the chip select pad 121b, the chip select pad 121c are each disposed on a corner of the rectangle of each memory chip. Those chip select pads each function as an input terminal for a chip select signal, and are directly wire bonded to the different stitches 111 of the mounting board 101.

Specifically, the chip select pad 121a, the chip select pad 121b, and the chip select pad 121c are wire bonded to the different second stitches 111. A second stitch 111a, a second stitch 111b, and a second stitch 111c are formed so as to be adjacent to the chip select pad 121a, the chip select pad 121b, and the chip select pad 121c, respectively. The chip select pad 121a and the second stitch 111a are connected to each other through a second wire 123a. The chip select pad 121b and the second stitch 111b are connected to each other through a second wire 123b. The chip select pad 121c and the second stitch 111c are connected to each other through a second wire 123c.

The control pads, address pads, or data pads 113a, the control pads, address pads, or data pads 113b, and the control pads, address pads, or data pads 113c are each function as a control terminal, an address terminal, or a data terminal in each chip, and specifically, each function as a control terminal or an address/data terminal. More specifically, the control pads each function as a control terminal except for the chip select, and includes a power supply terminal and a ground terminal. The control pads, address pads, or data pads of one chip are wire bonded to the first stitches 109 of the mounting board 101 directly or through the corresponding control pads, address pads, or data pads of another chip. In this case, on the mounting board 101, there are formed the control pads, address pads, or data pads 113a and the same number of first stitches 109, and the first stitches 109 are each adjacent to the control pads, address pads, or data pads 113a. Each of the control pads, address pads, or data pads 113a of the first memory chip 103a is wire bonded to each of the adjacent first stitches 109 through a first wire 115. Regarding the control pads, address pads, or data pads of each chip, the terminals having the same function between the adjacent chips are adjacent to each other to be bonded to each other.

Next, a description is given of a method of producing the semiconductor package 100.

First, there is provided the mounting board 101 on which the first stitches 109 are formed in a single line along one side of the rectangle and on which the second stitches 111 are formed in a single line along the side adjacent to the one side. Moreover, there are provided the first memory chip 103*a*, the second memory chip 103*b*, and the third memory chip 103*c* on each of which the electrode pads are arranged in a single line along one side of the rectangle. In the first embodiment of the present invention, the first memory chip 103*a*, the second memory chip 103*b*, and the third memory chip 103*c* each have the same planar shape and each include the same number of electrode pads arranged in the same manner.

Figure 5:
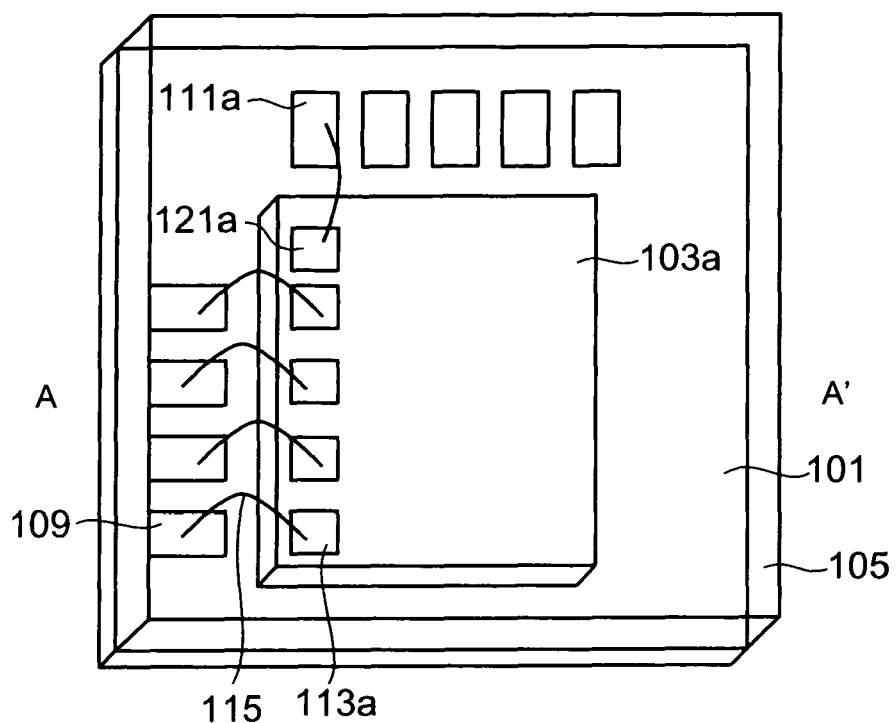
FIG. 5 is a perspective view showing a production process for the semiconductor package of FIG. 1.
Figure 6:
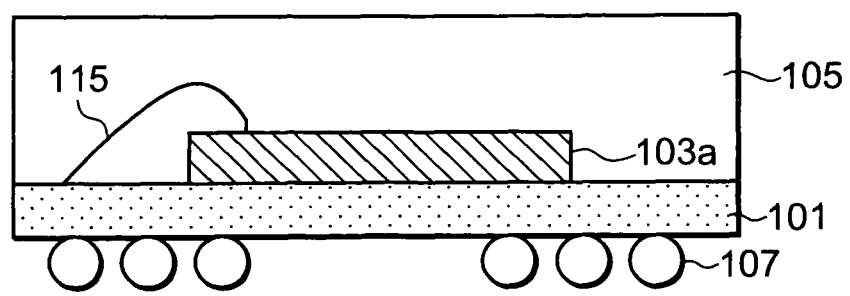
FIG. 6 is a cross-sectional diagram of the semiconductor package taken along the line A-A' of FIG. 5.

FIG. 5 is a perspective view showing a production process for the semiconductor package 100. FIG. 6 is a cross-sectional diagram of the semiconductor package 100 taken along the line A-A' of FIG. 5.

As shown in FIGS. 5 and 6, the first memory chip 103*a* is disposed so as to be brought into contact with an upper portion of the mounting board 101. In this case, the line of the electrode pads of the first memory chip 103*a* is disposed so as to be adjacent to the first stitches 109 of the mounting board 101. The control pads, address pads, or data pads 113*a* are wire bonded to the adjacent first stitches 109. Among the electrode pads of the first memory chip 103*a*, the chip select pad 121*a* is wire bonded to the adjacent second stitch 111*a*.

Then, on the first memory chip 103*a*, the second memory chip 103*b* is mounted. In this case, an electrode pad forming region of the second memory chip 103*b* is formed so as to be adjacent to an electrode pad forming region of the first memory chip 103*a* when viewed from above the second memory chip 103*b*. Further, the second memory chip 103*b* is displaced stepwise by a distance corresponding to a width of the electrode pad forming region of the first memory chip 103*a*, to be mounted on the first memory chip 103*a*. In addition, a displacement width of the second memory chip 103*b* with respect to the first memory chip 103*a* is set to be equal to an interval (pitch) between the second stitches 111.

Each of the control pads, address pads, or data pads 113*b* of the second memory chip 103*b* is wire bonded to each of the adjacent control pads, address pads, or data pads 113*a* of the first memory chip 103*a*. In other words, the control pads, address pads, or data pads 113*b* are connected to the first stitches 109 through the control pads, address pads, or data pads 113*a*. The chip select pad 121*b* of the second memory chip 103*b* is directly wire bonded to the second stitch 111*b*.

On the second memory chip 103*b*, the third memory chip 103*c* is mounted. Also in this case, the line of the electrode pads of the third memory chip 103*c* is disposed so as to be adjacent to the line of the electrode pads of the second memory chip 103*b*. Further, the third memory chip 103*c* is displaced stepwise with respect to the second memory chip 103*b* by a distance corresponding to a width of a region for forming the second memory chip 103*b*.

Each of the control pads, address pads, or data pads 113*c* of the third memory chip 103*c* is wire bonded to each of the adjacent control pads, address pads, or data pads 113*b* of the second memory chip 103*b*. The chip select pad 121*c* of the third memory chip 103*c* is directly wire bonded to the second stitch 111*c*.

After that, the chip mounting surface of the mounting board 101 is sealed with the sealing resin 105. On the back surface of the mounting board 101, the bump electrodes 107 are formed. By the above-mentioned process, the semiconductor package 100 as shown in FIGS. 1 to 4 is obtained. In the semiconductor package 100 thus obtained, the sides of the first memory chip 103*a*, the second memory chip 103*b*, and the third memory chip 103*c*, each of which faces the second stitches 111, are in line with each other, and sides thereof which face the sides facing the second stitches 111 are also in line with each other. Further, an entire region of the memory chip (for example, first memory chip 103*a*) positioned in a lower layer, other than the electrode pad forming region, is covered with the memory chip (for example, second memory chip 103*b*) positioned in an upper layer.

Next, a description is given of operations and effects of the first embodiment of the present invention.

In the first embodiment of the present invention, the electrode pads are arranged in a single line along only one side of the rectangle of the memory chip 103, and chip select terminals (chip select pads) are arranged on an extreme end of the line of the terminals (electrode pads) arranged on the one side.

On the mounting board 101, the first stitches 109 are arranged in a single line along the side on which the electrode pads are formed. In addition, the second stitches 111 are arranged in a single line along the side adjacent to the side on which the chip select terminals are arranged.

The chip select pad 121*a*, the chip select pad 121*b*, and the chip select pad 121*c* are each bonded from the side adjacent to the side on which the line of the electrode pads is disposed. As a result, also in a case where the stitches of the mounting board 101 are directly wire bonded to the chip select pads, the wires connected to the chip select pads of each chip can be prevented from striding over or intersecting another wire. Accordingly, even when a plurality of memory chips are stacked on top of each other, a space provided for preventing the wires from being brought into contact with each other can be reduced, which leads to a reduction in package area. Besides, the first stitches 109 and the second stitches 111 each can be formed in a single line, so an area of a stitch forming region on an outer periphery of the chip mounting region of the mounting board 101 can be minimized.

Also on the first memory chip 103*a* positioned in a lowermost layer, the chip select pad 121*a* is disposed on the end of the line of the electrode pads, and is wire bonded to the stitch (second stitch 111) formed on the side adjacent to the side on which the electrode pad is formed. As a result, each chip can be easily positioned. Besides, the wire bonding of the chip select pad can be easily performed.

In the first embodiment of the present invention, the memory chip positioned in the upper layer is displaced by the distance corresponding to the width of the electrode pad forming region, to be stacked on the memory chip positioned immediately below. Accordingly, the chip select pads are not overlapped with each other when viewed from above the third memory chip 103*c*. As a result, the second stitches 111 connected to the chip select pads can be arranged in a single line so as to be adjacent to the chip select pads, whereby the wire bonding can be performed more easily. Such an effect is remarkably exhibited when the displacement width of each chip is equal to the interval between the second stitches 111. Note that the interval between the second stitches 111 specifically refers to a distance between centers of two adjacent second stitches 111.

Further, in the first embodiment of the present invention, the memory chip positioned in the upper layer is displaced by the distance corresponding to the width of the electrode pad forming region, to be stacked on the memory chip formed immediately below. In addition, the control pads, address pads, or data pads of the memory chip positioned in the upper layer are each connected to the control pads, address pads, or data pads of the memory chip formed immediately below, whereby the control pads, address pads, or data pads of the memory chip positioned in the upper layer are connected to the first stitches 109 through the control pads, address pads, or data pads of the memory chip positioned in the lower layer. For this reason, the first wires 115, first wires 117, and first wires 119 each can be reduced in length, and a height of a loop can be lowered. Moreover, the first wires can be prevented from intersecting each other. Accordingly, the control pads, address pads, or data pads of each memory chip can be easily connected by wire bonding to the first stitches 109 while the wires are prevented from being bulky.

As described above, in the first embodiment of the present invention, stacking of a plurality of stages of memories can be realized with a minimum package area. Further, such a structure can be suitably used also in a case of semiconductor packaging for stacking a plurality of memory chips having the same planar shape, for example.

In FIG. 1, the second stitches 111, the number of which is larger (five in FIG. 1) than that of the chips (three in FIG. 1), are formed. As a result, the semiconductor package can easily deal with the change in the number of stacked memory chips due to a subsequent design change.

Note that, in the first embodiment and other embodiments to be described later, the control pads, address pads, or data pads of the memory chips may be arranged in the following manner.

Figure 7:
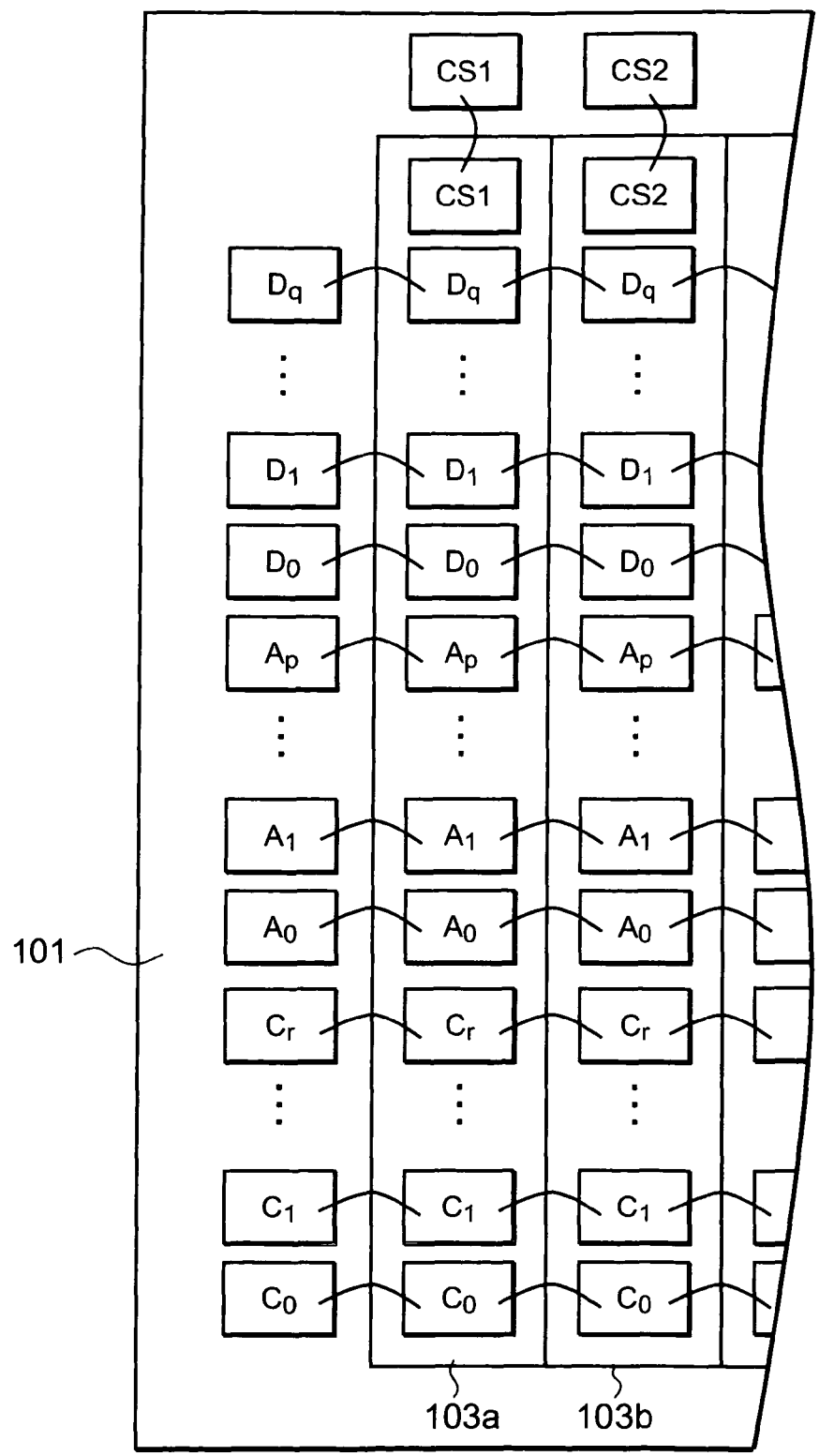
FIG. 7 is a plan view showing an example of arrangement of electrode pads of the semiconductor package according to the embodiment of the present invention.

FIG. 7 is a plan view showing an example of the arrangement of the electrode pads of the semiconductor package according to the first embodiment of the present invention. In FIG. 7, the number of the electrode pads formed on one side of the first memory chip 103a is equal to that of the electrode pads formed on one side of the second memory chip 103b. The chip select pads (CS1 and CS2) of the first memory chip 103a and the second memory chip 103b are arranged so as to be adjacent to each other, and the control pads, address pads, or data pads of the first memory chip 103a and the second memory chip 103b are arranged so as to be adjacent to each other.

Specifically, the plurality of control pads, address pads, or data pads of each of the first memory chip 103a and the second memory chip 103b include p number of address pads ($A_0$ to $A_p$ in FIG. 7), q number of data pads ($D_0$ to $D_q$ in FIG. 7), and r number of control pads ($C_0$ to $C_r$ in FIG. 7). Note that p, r, and q are each an integer equal to or larger than 0, and p+q+r is a positive integer. A p-th address pad of the first memory chip 103a and that of the second memory chip 103b are arranged so as to be adjacent to each other and wire bonded to each other. In addition, a q-th data pad of the first memory chip 103a and that of the second memory chip 103b, and a r-th control pad of first memory chip 103a and that of the second memory chip 103b are arranged so as to be adjacent to each other and wire bonded to each other.

In the arrangement, the pads other than the chip select pad of the chip positioned in the upper layer can be connected to the first stitches through the pads other than the chip select pad of the chip positioned in the lower layer. As a result, a wiring distance between the chips can be reduced and the wires are prevented from intersecting each other, whereby the wires can be arranged in a more orderly manner.

Note that specific examples of $C_0$ to $C_r$ of FIG. 7 include, in a double data rate (DDR) synchronous dynamic random access memory (SDRAM), a row address strobe input (RASB), a column address strobe input (CASB), clock inputs, (CK and CKB), a write enable input (WEB), bank address inputs (BA0 and BA1), data strobe input/outputs (DQS, LDQS, and UDQS), DQ write mask enable inputs (DM, LDM, and UDM), a power supply voltage (VDD), and a ground (VSS). A predetermined number of given control terminals can be provided.

In the following embodiments, differences from the first embodiment will be mainly described.

Second Embodiment

Figure 8:
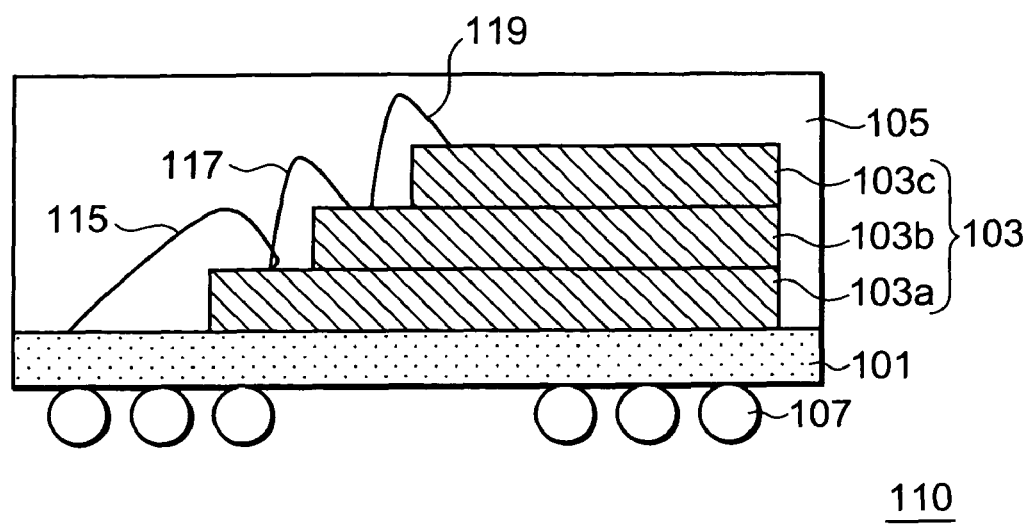
FIG. 8 is a cross-sectional diagram showing a structure of a semiconductor package according to a second embodiment of the present invention.

FIG. 8 is a cross-sectional diagram showing a structure of a semiconductor package according to a second embodiment of the present invention. A basic structure of a semiconductor package 110 shown in FIG. 8 is similar to that of the semiconductor package 100 (see FIG. 2) according to the first embodiment of the present invention. However, the semiconductor package 110 is different from the semiconductor package 100 in that the side adjacent to the second stitches 111, that is, the side adjacent to the side on which the electrode pads are formed, of the chip positioned in the upper layer is shorter than that of the chip positioned in the lower layer.

Also in the semiconductor package 110, as in the case of the semiconductor package 100, the length of the side of each of the first memory chip 103a, the second memory chip 103b, and the third memory chip 103c, on which the electrode pads are arranged, is the same. Also in the semiconductor package 110, when viewed from above the second memory chip 103b, one side on which the electrode pads of the first memory chip 103a are arranged and one side on which the electrode pads of the second memory chip 103b are arranged are adjacent to each other, and a side opposite to the one side of the first memory chip 103a is in line with a side opposite to the one side of the second memory chip 103b.

Also in the second embodiment of the present invention, the same operations and effects as those of the first embodiment of the present invention can be obtained.

In the second embodiment of the present invention, the sides, each of which faces the side on which the electrode pads are arranged, of the chips are in line with each other in plan view. For this reason, as compared with the semiconductor package according to the first embodiment (see FIG. 1), the package area can be further reduced, which leads to further reduction in package size.

Also in the second embodiment of the present invention, the stitches are formed along only two adjacent sides of the memory chip. Accordingly, as compared with the semiconductor package (FIG. 10) to be described later in a third embodiment of the present invention, the package size with the same number of stacked chips can be further reduced.

Figure 9:
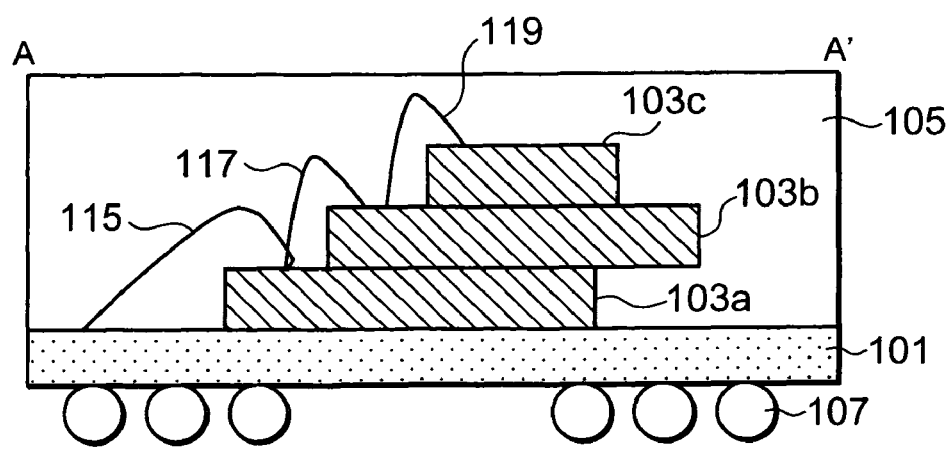
FIG. 9 is a cross-sectional diagram showing the structure of the semiconductor package according to the second embodiment of the present invention.

Note that in FIG. 8, there is illustrated an example where the entire region other than the electrode pad forming region is covered with the chip positioned immediately above, in plan view, in each case of the first memory chip 103a and the second memory chip 103b. Alternatively, for example, a part of the region other than the chip forming region of the second memory chip 103b is not necessarily covered with the chip positioned immediately above, that is, the third memory chip 103c. FIG. 9 is a cross-sectional diagram showing the structure of the semiconductor device.

Third Embodiment

Figure 10:
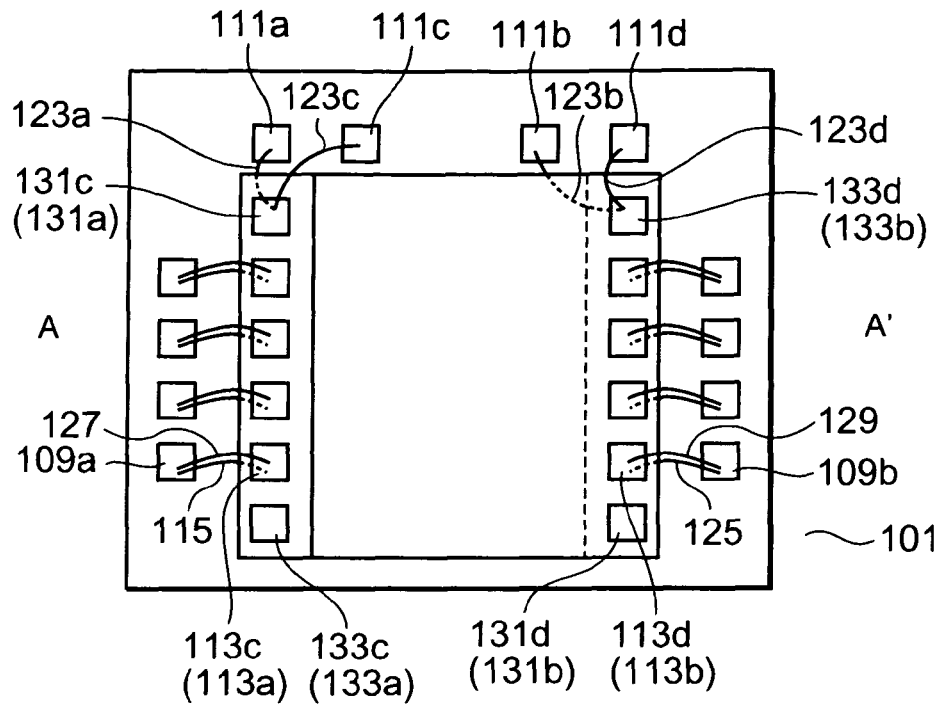
FIG. 10 is a plan view showing a structure of a semiconductor package according to a third embodiment of the present invention.
Figure 11:
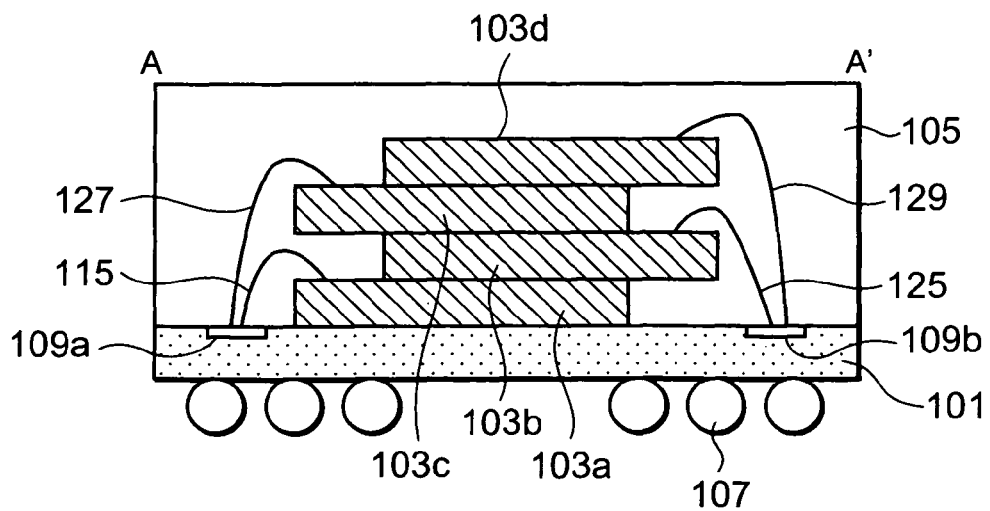
FIG. 11 is a cross-sectional diagram of the semiconductor package taken along the line A-A' of FIG. 10.

FIG. 10 is a plan view showing a structure of a semiconductor package according to a third embodiment of the present invention. FIG. 11 is a cross-sectional diagram of the semiconductor package taken along the line A-A' of FIG. 10.

A basic structure of a semiconductor package 120 shown in FIGS. 10 and 11 is similar to that of the semiconductor package 100 shown in FIGS. 1 to 3. However, the semiconductor package 120 further includes a fourth memory chip 103*d* stacked on the third memory chip 103*c*. The first memory chip 103*a*, the second memory chip 103*b*, the third memory chip 103*c*, and the fourth memory chip 103*d* each have the same planar shape and each include the electrode pads arranged in the same manner. On each of the first memory chip 103*a* and the third memory chip 103*c*, the electrode pads are arranged in a single line along the same side. The line of the electrode pads of each of the second memory chip 103*b* and the fourth memory chip 103*d* is formed on a side opposite to the line of the electrode pads of the first memory chip 103*a*.

The second memory chip 103*b* is displaced by a distance corresponding to a width of the electrode pad forming region of the first memory chip 103*a*, to be stacked thereon. The third memory chip 103*c* is positioned immediately above the first memory chip 103*a*, and the fourth memory chip 103*d* is positioned immediately above the second memory chip 103*b*. The first memory chip 103*a*, the second memory chip 103*b*, the third memory chip 103*c*, and the fourth memory chip 103*d* each include two chip select pads (first chip select pads 131*a*, 131*b*, 131*c*, and 131*d*, and second chip select pads 133*a*, 133*b*, 133*c*, and 133*d*). The first chip select pad is disposed on an end of one side of the line of the electrode pads, and the second chip select pad is formed on another end thereof. In each chip, one of the first chip select pad and the second chip select pad functions as a chip select terminal to be connected to the second stitch of the mounting board 101, and the other thereof is a dummy chip select pad.

In planar arrangement shown in FIG. 10, the first chip select pad 131*a*, the second chip select pad 133*b*, the first chip select pad 131*c*, and the second chip select pad 133*d* are arranged on the same side.

On the mounting board 101, the second stitch 111*a*, the second stitch 111*b*, the second stitch 111*c*, and a second stitch 111*d* are arranged in a single line along the side on which the first chip select pad 131*a*, the second chip select pad 133*b*, the first chip select pad 131*c*, and the second chip select pad 133*d* are arranged.

Further, on the mounting board 101, the first stitches 109*a* are formed along the side on which the control pads, address pads, or data pads 113*a* and the control pads, address pads, or data pads 113*c* are arranged, and first stitches 109*b* are formed along the side on which the control pads, address pads, or data pads 113*b* and control pads, address pads, or data pads 113*d* are arranged. The line of the first stitches 109*a* and the line of the first stitches 109*b* are formed in parallel with each other, and each are perpendicular to the line of the second stitches 111.

The control pads, address pads, or data pads 113*a* and the control pads, address pads, or data pads 113*c* are connected to the common first stitches 109*a* through the first wires 115 and first wires 127. The control pads, address pads, or data pads 113*b* and the control pads, address pads, or data pads 113*d* are connected to the common first stitches 109*b* through first wires 125 and first wires 129.

Also in the semiconductor package shown in FIGS. 10 and 11, the electrode pads of each memory chip are formed in a single line along one side of the rectangle, and the chip select pad is formed on the end of the line of the electrode pads. In addition, the chip select pad is wire bonded to the second stitch 111 formed on the adjacent side. Accordingly, the same effects as those of the above embodiments can be obtained.

Further, in the semiconductor package shown in FIGS. 10 and 11, the lines of the electrode pads of memory chips are alternately formed on opposite sides of the semiconductor chips having the same planar shape, and the memory chips are alternately displaced to be stacked so that only the electrode pad forming region of the chip positioned in the lower layer is exposed from the chip positioned immediately above. Accordingly, in a case where the number of the stacked chips is large, for example, 4 or more, the package size can be more effectively reduced.

Further, as shown in FIG. 10, with a structure in which the chip select pads are formed on both ends of the electrode pad forming region of each chip and given one of those pads is used as an electrode pad to be actually connected to the second stitch, even when the chips are rotated by 180 degrees within a plane to be alternately formed on one another, the chip select terminals can be collectively arranged on one side adjacent to the side on which the electrode pads are formed. As a result, as in the first embodiment of the present invention, the second stitches are formed only on one side adjacent to the first stitches, and the second stitches can be connected to the chip select terminals of the chips.

Figure 12:
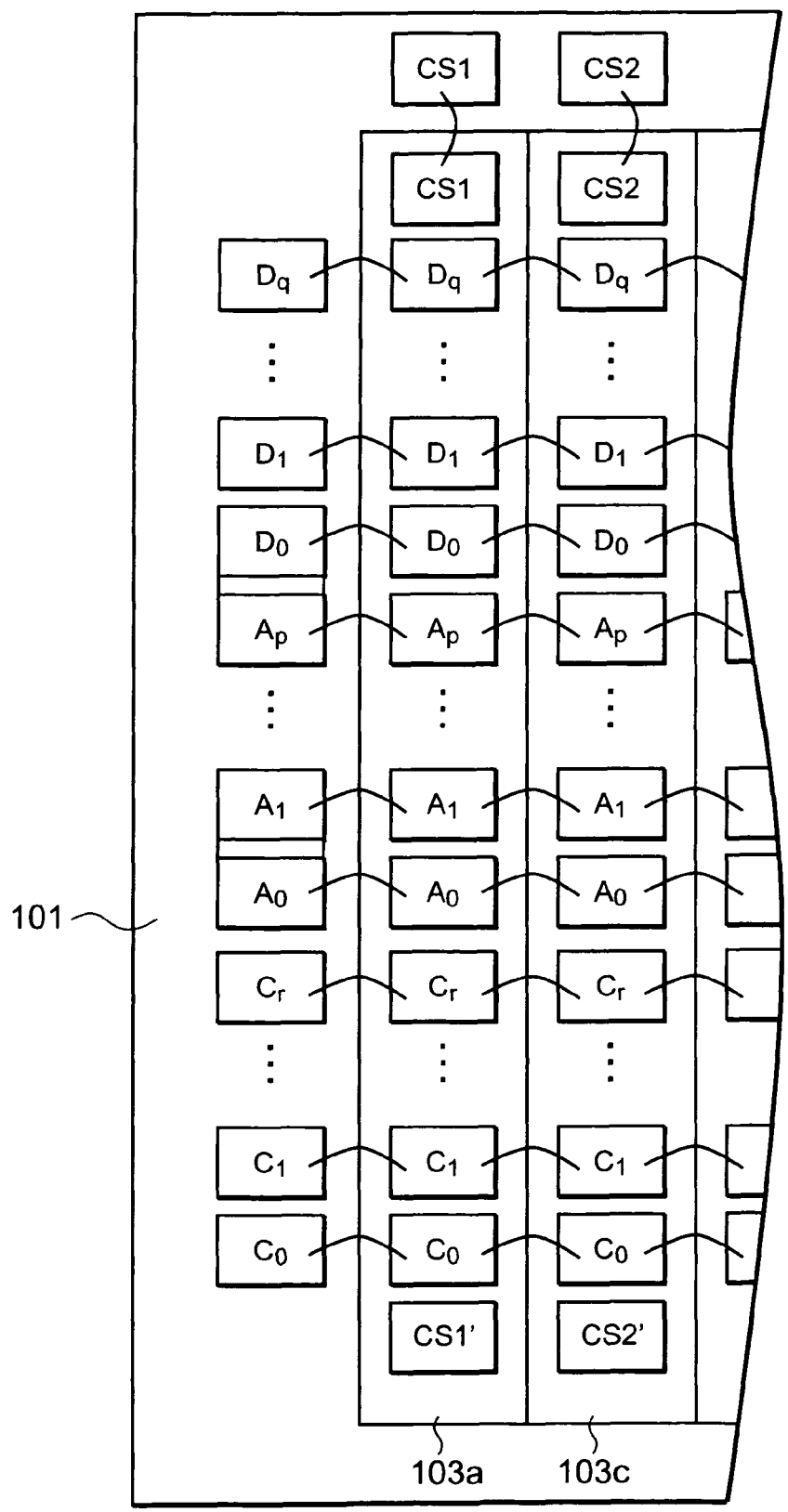
FIG. 12 is a plan view showing another example of arrangement of electrode pads of the semiconductor package according to the third embodiment of the present invention.
Figure 13:
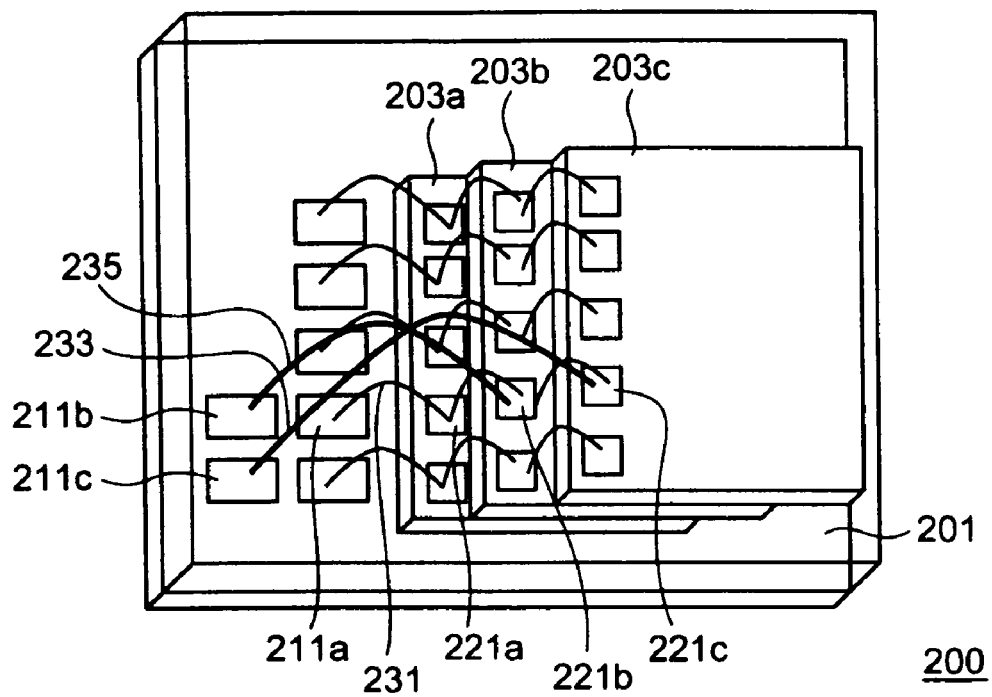
FIG. 13 is a plan view showing a structure of a semiconductor device.
Figure 14:
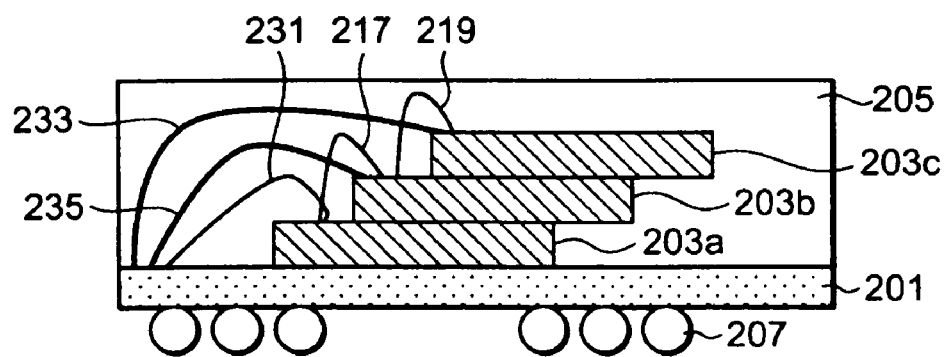
FIG. 14 is a cross-sectional diagram of the semiconductor device of FIG. 13.

Note that in the third embodiment and other embodiments described in the specification of the present invention, the control pads, address pads, or data pads of each memory chip may be arranged in the following manner. FIG. 12 is a plan view showing another example of the arrangement of the electrode pads of the semiconductor package. A basic structure of a semiconductor package of FIG. 12 is similar to that of FIG. 7, but is different in that CS is formed on one end of the line of the electrode pads of each chip, and in addition, CS' is formed on another end thereof.

As described above, the embodiments of the present invention are described with reference to the drawings, but the above embodiments are illustrative of the present invention. Various structures other than the above-mentioned structures can also be employed. It is apparent that the present invention is not limited to the above embodiments, but may be modified and changed without departing from the scope and spirit of the invention.

What is claimed is:

1. A semiconductor device, comprising:
  a mounting board comprising first stitches arranged along a first line on a surface thereof, and comprising-second stitches arranged along a second line on the surface thereof, the first line and the second line intersecting with each other;
  a first semiconductor chip mounted on the mounting board and comprising first electrode pads arranged along one side of the first semiconductor chip, the one side being substantially in parallel with the first stitches; and
  a second semiconductor chip mounted on the first semiconductor chip and comprising second electrode pads arranged along one side of the second semiconductor chip, the one side of the second semiconductor chip being substantially in parallel with the first electrode pads,
  wherein one of the second stitches is connected to one of the first electrode pads which is adjacent to the one of the second stitches through a wire, whereas the one of the second stitches is unconnected to other first electrode pads and respective second electrode pads through a wire.

2. The semiconductor device according to claim 1, wherein another one of the second stitches is connected to one of the second electrode pads which is adjacent to the another one of the second stitches through a wire, whereas the another one of the second stitches is unconnected to other second electrode pads and respective first electrode pads.

3. The semiconductor device according to claim 2, wherein the other first electrode pads are connected to the first stitches and the other second electrode pads through wires.

4. The semiconductor device according to claim 3, further comprising a third semiconductor chip mounted on the second semiconductor chip and comprising third electrode pads arranged along one side of the third semiconductor chip, the one side of the third semiconductor chip being substantially in parallel with the second electrode pads, and wherein a further one of the second stitches is connected to one of the third electrode pads which is adjacent to the further one of the second stitches through a wire, whereas the further one of the second stitches is unconnected to other third electrode pads and the respective second electrode pads.

5. The semiconductor device according to claim 4, wherein the one of the second stitches is unconnected to respective third electrode pads through a wire, wherein the another one of the second stitches is unconnected to the respective third electrode pads through a wire, and wherein the further one of the second stitches is unconnected to the respective first electrode pads through a wire.

6. The semiconductor device according to claim 1, wherein a chip select signal for the first semiconductor chip is input into the one of the second stitches.

7. The semiconductor device according to claim 1, wherein the first and second semiconductor chips comprise memory chips.

8. The semiconductor device according to claim 1, wherein an area of the first semiconductor chip on which the first electrode pads are formed is larger than an area of the second semiconductor chip on which the second electrode pads are formed.

9. The semiconductor device according to claim 4, wherein the third semiconductor chip is positioned immediately above the first semiconductor chip.

10. The semiconductor device according to claim 1, wherein the first line is perpendicular to the second line.

11. The semiconductor device according to claim 1, wherein the one of the second stitches is connected to one of the first electrode pads which is most adjacent to the one of the second stitches among the first electrode pads through a wire.

12. The semiconductor device according to claim 1, wherein the first semiconductor chip comprises a memory chip.

13. The semiconductor device according to claim 1, wherein the second semiconductor chip comprises a memory chip.

14. A semiconductor device, comprising:

a mounting board comprising a plurality of first stitches arranged along a first line on a surface thereof, and comprising a plurality of second stitches arranged along a second line on the surface thereof, the first line and the second line intersecting with each other;

a first semiconductor chip mounted on the mounting board and comprising a plurality of first electrode pads arranged along a first side of the first semiconductor chip, the first side being substantially parallel with the plurality of first stitches; and a second semiconductor chip mounted on the first semiconductor chip and comprising a plurality of second electrode pads arranged along a first side of the second semiconductor chip, the first side of the second semiconductor chip being substantially parallel with the first electrode pads, wherein a first one of the plurality of second stitches is connected to a first one of the first electrode pads, the first of the first electrode pads being adjacent to the first one of the second stitches, and is connected thereto via a wire, and wherein the plurality of the first stitches are electrically connected to respective adjacent ones of the plurality of the first electrode pads, other than the first one of the plurality of first electrode pads, and respective adjacent ones of the plurality of the second electrode pads, other than the first one of the plurality of second electrode pads.

15. The semiconductor device according to claim 14, wherein a second one of the plurality of second stitches is connected to a first one of the second electrode pads, the first of the second electrode pads being adjacent to the first one of the second stitches, and is connected thereto via a wire.

16. The semiconductor device according to claim 14, further comprising a third semiconductor chip mounted on the second semiconductor chip and comprising a plurality of third electrode pads arranged along a first side of the third semiconductor chip, the first side being substantially parallel with the second electrode pads, wherein a third one of the second stitches is electrically connected to a respective adjacent first one of the third electrode pads through a wire, and wherein the plurality of the first stitches are electrically connected to respective adjacent ones of the plurality of the third electrode pads, other than the first one of the plurality of third electrode pads.

* * * * *